United States Patent

Wessely et al.

[11] Patent Number: 5,144,532
[45] Date of Patent: Sep. 1, 1992

[54] CIRCUIT BOARD ASSEMBLY

[75] Inventors: Hermann Wessely, Munich; Otmar Fritz, Neukeferloh, both of Fed. Rep. of Germany

[73] Assignee: Siemens Nixdorf Informationssystem AG, Fed. Rep. of Germany

[21] Appl. No.: 700,502

[22] Filed: May 15, 1991

[30] Foreign Application Priority Data

May 16, 1990 [DE] Fed. Rep. of Germany ....... 4015788

[51] Int. Cl.$^5$ .............................................. H05K 7/20
[52] U.S. Cl. ..................................... 361/385; 357/79; 357/82; 361/386; 361/388
[58] Field of Search .............................. 357/79, 81, 82; 361/383–389

[56] References Cited

U.S. PATENT DOCUMENTS

| | | | |
|---|---|---|---|
| 4,521,829 | 6/1985 | Wessely | 361/386 |
| 4,581,679 | 4/1986 | Smolley | 361/414 |
| 4,774,632 | 9/1988 | Neugebauer | 361/388 |
| 4,939,624 | 7/1990 | August et al. | 361/386 |
| 4,958,258 | 9/1990 | Charruau | 361/386 |
| 5,036,384 | 7/1991 | Umezawa | 357/79 |

Primary Examiner—Gregory D. Thompson
Attorney, Agent, or Firm—Hill, Van Santen, Steadman & Simpson

[57] ABSTRACT

A circuit board assembly for data equipment such as those having large numbers of layers and great power requirements in a small space having high computer performance, includes a multi-layer printed circuit board in laminated technology provided with voltage supply and signal carrying layers and pressure contacts at both sides connecting the multi-layer printed circuit board to further printed circuit boards. The further printed circuit boards, which are formed using micro-wiring technology, include backsides which are free of electrical components and connected to the pressure contacts and opposite sides carrying integrated electrical elements such as circuit chips forming an electrical circuit. Cooling plates are pressed against the surfaces of the circuit chips.

8 Claims, 2 Drawing Sheets

CIRCUIT BOARD ASSEMBLY

BACKGROUND OF THE INVENTION

1. Field of the Invention

The present invention is directed to a circuit board assembly, particularly for use in data equipment.

2. Description of the Related Art

As computers require more and more switching functions in a smaller space, it becomes increasingly more difficult to manufacture computers with a high number of circuit board positions, particularly in assemblies for central processor units. Likewise, it is not possible to supply voltages in traditional ways via plug pins since the electrical power requirements are increased more and more per available area and because the large amount of power to be dissipated as a result thereof.

SUMMARY OF THE INVENTION

An object of the present invention is to provide an electrical circuit board assembly having an optimum ratio of space to dissipated power.

This and other objects and advantages of the invention are achieved by an assembly including a multi-layer printed circuit board which has been produced using standard laminating technology and which is provided with a plurality of power and signal lines. Further printed circuit boards that are constructed using micro-wiring technology and which have integrated devices such as chips arranged on one side forming an electrical circuit and the other side being free of such devices are also provided. These further printed circuit boards are connected to the multi-layer board, preferably at both sides, via pressure contacts. Cooling plates or heat sinks, are provided pressing against the surfaces of the integrated circuit chips on the further printed circuit boards.

As the result of the foregoing measures, a circuit board assembly is obtained which provides an optimum ratio of switching functions while occupying little space. This assembly is particularly suited for use in general computers, or even in so-called super computers, having extremely high computer performance.

The cooling plates used in the present assembly are preferably liquid-cooled. In a preferred embodiment, the power supply voltages are carried to the printed circuit boards at three sides thereof and the signal lines are connected to the printed circuit boards at the remaining, fourth side via plugs.

The invention shall be set forth in greater detail with reference to exemplary embodiments described in conjunction with the drawings.

BRIEF DESCRIPTION OF THE DRAWINGS

FIG. 2 is a plan view of the present assembly with.

DESCRIPTION OF THE PREFERRED EMBODIMENTS

Figure 1:
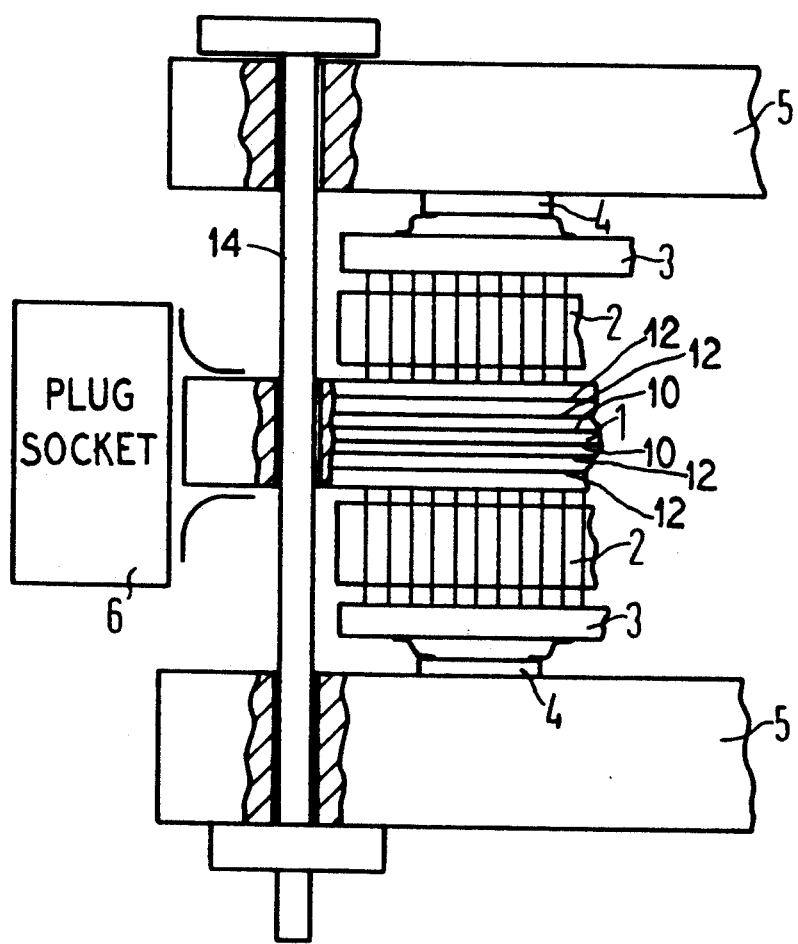
FIG. 1 is a schematic side view of a circuit board assembly according to the principles of the present invention.

Shown in FIG. 1 is a multi-layer printed circuit board 1 that is constructed using standard laminating technology. The multi-layer board 1 includes two signal carrying layers 10 toward the inside and four power supply layers 12 toward the outside in the present example. The multi-layer board 1 is arranged in the center of the present assembly and on opposite sides thereof there are two further printed circuit boards 3 which are constructed using micro-wiring technology. The further printed circuit boards 3 are connected to the multi-layer board 1 via pressure contacts 2 which conduct the electrical signals and power supply voltages between these circuit boards. Mounted on the further printed circuit boards 3 are devices such as integrated circuit chips 4 on the side opposite the pressure contacts 2. The integrated circuit chips and other electrical devices 4 form electrical circuits in, for example, a high performance computer. Cooling plates 5 are pressed directly against the upper sides of the chips 4, and are held in place by clamps 14 extending through the cooling plates 5 and the multi-layer board 1. In a preferred embodiment, the cooling plates 5 are liquid cooled.

Electrical energy, such as the power supply voltages and the signals are transmitted to the multi-layer board 1 via a plug socket 6 which is shown schematically mounted at one edge thereof. Such plug sockets 6 may be provided at all four sides of the multi-layer board 1. The plug sockets 6 connect to electrical surface contacts on the outside surfaces of the multi-layer board 1, these surface contacts also referred to as contact locations, being connected to the signal and voltage carrying layers 10 and 12 in the known way. These layers also connect to the pressure contacts 2 at the appropriate locations.

Figure 2:
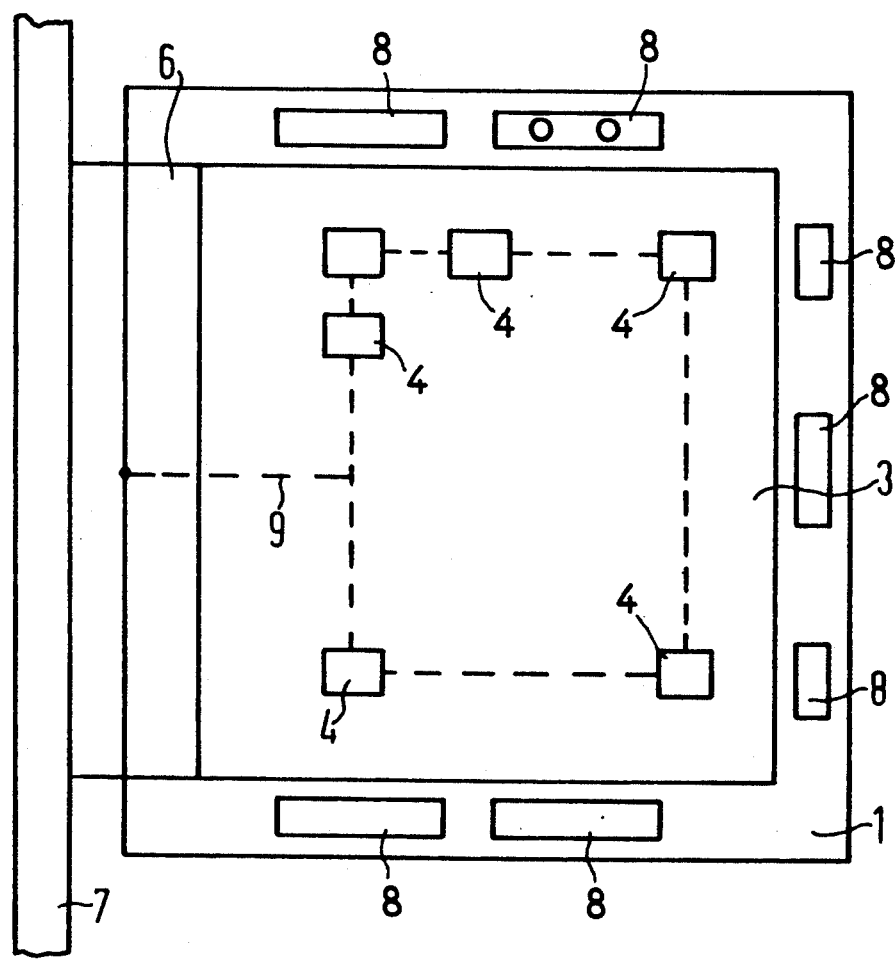

FIG. 2 shows a detailed view of the circuit board assembly of the present invention. The multi-layer board 1 projects beyond the printed circuit boards 3 which carry the chips 4. In the illustrated embodiment, the multi-layer board 1 extends beyond all four sides of the printed circuit boards 3. Voltage feeds 8 which are formed as contact spots are provided at the projecting edge regions along three sides of the multi-layer board 1. These contact spots 8 are connected to respective power supply areas in the interior regions of the multi-layer board 1 via inter-layer connections. At a fourth side of the multi-layer board 1 is provided the plug socket 6 into which the multi-layer board 1 is inserted. The plug socket 6 is mounted on a plate or back plane 7 and carries signals via signal layers through the multi-layer board 1 to the chips 4 on the printed circuit boards 3. The connection of the signal leads is shown schematically by broken lines 9.

Thus, there is shown and described a circuit board assembly for achieving high density mounting of circuit boards 3 through the use of a multi-layer board 1 mounted between two circuit boards which is fitted with various plug socket connections at the edges of the multi-layer board 1. Since the high density electronics of the present circuit board assembly increases the amount of heat per area which must be dissipated, the cooling plates 5 (which have not been shown in FIG. 2 to permit viewing of the rest of the assembly) are mounted directed to the integrated circuit chips 4 on either side of the assembly. The present invention therefore permits two circuit boards to be mounted in a position or slot in which only one circuit board could previously have been mounted. Since the size of plug sockets and back plane requirements previously limited the circuit board density in data equipment, the present invention overcomes the size limitations and permits greater reduction in the size of data equipment.

Although other modifications and changes may be suggested by those skilled in the art, it is the intention of the inventors to embody within the patent warranted hereon all changes and modifications as reasonably and properly come within the scope of their contribution to the art.

We claim:

1. A circuit board assembly, comprising:
   a multi-layer printed circuit board formed in laminating technology having a plurality of layers laminated over one another and contact locations on at least one surface thereof;
   pressure contacts pressed against said contact locations of said multi-layer printed circuit board;
   further printed circuit boards formed in micro-wiring technology upon which are mounted integrated circuit units forming an electrical circuit, said further printed circuit boards being connected electrically to said multi-layer printed circuit board by said pressure contacts;
   cooling plates pressing directly against a surface of each of said integrated circuit units on said further printed circuit boards; and
   clamp means connected between said multi-layer printed circuit board and said further printed circuit boards and said cooling plates to exert a pressing force therebetween.

2. A circuit board assembly as claimed in claim 1, wherein said cooling plates are liquid cooled cooling plates.

3. A circuit board assembly as claimed in claim 1, wherein said multi-layer board has connections for power supply voltages at three edges and connections for electrical data signals at a fourth edge.

4. A circuit board assembly for use in data equipment, comprising:
   a laminated multi-layer board having electrical conducting layers, ones of said electrical conducting layers carrying supply voltages and others of said electrical conducting layers carrying data signals, said laminated multi-layer board being provided with contact paths along at least one edge electrically connected to said electrical conducting layers;
   at least one further circuit board carrying electrical components forming an electrical circuit;
   contact means for electrically connecting said electrical conducting layers of said laminated multi-layer board to said electrical circuit on said at least one further circuit board;
   means for clamping said laminated multi-layer board to said at least one further circuit board with said contact means therebetween; and
   at least one cooling plate mounted abutting said electrical components on said at least one further circuit board.

5. A circuit board assembly as claimed in claim 4, wherein said at least one further circuit board comprises two further circuit boards, a first of said two further circuit boards being mounted on one side of said laminated multi-layer board and a second of said two further circuit boards being mounted on a second side of said laminated multi-layer board.

6. An electrical transmission and distribution assembly for circuit boards, comprising:
   a multi-layer printed circuit board having a plurality of signal supply layers and power supply layers laminated over one another, said multilayer printed circuit board including surface contacts at both sides electrically connected to said plurality of signal and power supply layers;
   pressure contacts bearing against said surface contacts at both sides of said multi-layer printed circuit boards to form electrical connections between said pressure contacts and said surface contacts;
   further printed circuit boards having first sides facing toward said multi-layer printed circuit board in electrical contact with said pressure contacts and integrated electrical devices mounted on second sides facing away from said multi-layer printed circuit board, said integrated electrical devices being electrically connected to one another to form an electrical circuit and to said signal supply layers and said power supply layers through said pressure contacts;
   cooling plates pressed against said integrated electrical devices; and
   clamp means for clamping said multi-layer printed circuit board and said further printed circuit boards and said cooling plates together.

7. A high density circuit board assembly for use in a computer, comprising:
   a first circuit board having a plurality of layers laminated together, said plurality of layers including signal carrying layers and including power supply layers, said first circuit board including electrical surface contacts adjacent an edge of said first circuit board;
   an electrical plug socket mounted on said edge of said first circuit board and in electrical contact with said electrical surface contacts;
   a second circuit board having electrical components mounted on a first side of said second circuit board and microwiring electrically connecting said electrical components to form an electrical circuit, said first and second circuit boards being disposed parallel and adjacent to one another so that a second side of said second circuit board faces said first circuit board;
   contacts extending between said first and second circuit boards to electrically connect the electrical circuit on said second circuit board to said signal carrying layers and said power supply layers on said first circuit board; and
   a cooling plate disposed parallel and adjacent to said second circuit board at said first side of said second circuit board and in thermal contact with said electrical components on said first side of said second circuit board.

8. A high density circuit board assembly as claimed in claim 7, further comprising:
   a third circuit board having electrical components mounted on a first side of said third circuit board and microwiring electrically connecting said electrical components to form an electrical circuit, said third circuit board being disposed parallel and adjacent to said first circuit board on a side of said first circuit board opposite said second circuit board so that a second side of said third circuit board faces said first circuit board;
   further contacts extending between said first and third circuit boards to electrically connect the electrical circuit on said third circuit board to said signal carrying layers and said power supply layers on said first circuit board; and
   a cooling plate disposed parallel and adjacent to said third circuit board at said first side of said third circuit board and in thermal contact with said electrical components on said first side of said third circuit board.

* * * * *